(12) United States Patent
Cheng et al.

(10) Patent No.: US 6,495,426 B1
(45) Date of Patent: Dec. 17, 2002

(54) METHOD FOR SIMULTANEOUS FORMATION OF INTEGRATED CAPACITOR AND FUSE

(75) Inventors: Chuan-Cheng Cheng, Fremont, CA (US); Yauh-Ching Liu, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/925,694

(22) Filed: Aug. 9, 2001

(51) Int. Cl.[7] .............................................. H01L 21/20
(52) U.S. Cl. ........................ 438/393; 438/132; 438/250; 438/251; 438/252; 438/394; 438/395
(58) Field of Search ................................ 438/393, 394, 438/395, 250, 251, 252, 238, 239, 132

(56) References Cited

U.S. PATENT DOCUMENTS 5,795,819 A * 8/1998 Motsiff et al.
6,096,619 A * 8/2000 Yamamoto et al.
6,329,234 B1 * 12/2001 Ma et al.
6,333,545 B1 * 12/2001 Ema

* cited by examiner

*Primary Examiner*—Long Pham
(74) *Attorney, Agent, or Firm*—Luedeka, Neely & Graham

(57) ABSTRACT

A process for forming a capacitive structure and a fuse structure in an integrated circuit device includes forming a first capacitor plate and first and second fuse electrodes in a first dielectric layer of the device. In a second dielectric layer overlying the first dielectric layer, a capacitor dielectric section overlying the first capacitor plate, and a fuse barrier section overlying and between the first and second fuse electrodes are formed simultaneously. In a conductive layer overlying the second dielectric layer, a second capacitor plate overlying the capacitor dielectric section, and a fuse overlying the fuse barrier section and contacting the first and second fuse electrodes are formed simultaneously. The capacitor dielectric section and the fuse barrier section may be defined simultaneously by selectively removing portions of the first dielectric layer during a single etching step. The second capacitor plate and the fuse may be defined simultaneously by selectively removing portions of the conductive layer during a single etching step. Thus, the invention provides for forming various structures of the capacitor and the fuse during the same photomask, patterning, and etching steps, thereby reducing fabrication cost and time.

16 Claims, 4 Drawing Sheets

METHOD FOR SIMULTANEOUS FORMATION OF INTEGRATED CAPACITOR AND FUSE

FIELD

This invention relates to the field of integrated circuit fabrication. More particularly, the invention relates to forming metal-insulator-metal capacitor structures, pad structures, and fuse structures.

BACKGROUND

Metal-insulator-metal capacitors are widely used in mixed signal CMOS integrated structures because of the ability to precisely control their capacitance based on dimensional control. Metal fuses are also widely used to provide redundancy in embedded CMOS memory, thereby increasing the yield of application-specific integrated circuits. Processes for forming a metal-insulator-metal capacitor structures and fuse structures in integrated circuits have generally required several photomask, pattern, and etch steps to form the capacitors, and several more such process steps to form the fuses. Each photomask, pattern, and etch step adds significant cost, process time, and potential for error to the overall circuit fabrication process.

What is needed, therefore, is a process for forming metal-insulator-metal capacitor and fuse structures using fewer photomask, pattern, and etch steps.

SUMMARY

The above and other needs are met by a process for simultaneously forming a capacitive structure and a fuse structure in an integrated circuit device. The process includes forming a first capacitor plate and first and second fuse electrodes in a first dielectric layer of the device. In a second dielectric layer overlying the first dielectric layer, a capacitor dielectric section overlying the first capacitor plate, and a fuse barrier section overlying and between the first and second fuse electrodes are formed simultaneously. In a conductive layer overlying the second dielectric layer, a second capacitor plate overlying the capacitor dielectric section, and a fuse overlying the fuse barrier section and contacting the first and second fuse electrodes are formed simultaneously.

In various preferred embodiments of the invention, the capacitor dielectric section and the fuse barrier section are defined simultaneously by selectively removing portions of the first dielectric layer, such as during a single etching step. Also in preferred embodiments of the invention, the second capacitor plate and the fuse are defined simultaneously by selectively removing portions of the conductive layer, such as during a single etching step. Thus, the invention provides for forming various structures of the capacitor and the fuse during the same photomask, patterning, and etching steps, thereby reducing fabrication cost and time.

In another preferred embodiment, the process includes forming a dielectric layer over the capacitor and the fuse, and subsequently selectively removing a portion of the dielectric layer over the fuse such that a desired thickness of the dielectric layer remains over the fuse. The desired thickness of the dielectric layer over the fuse introduces a minimal amount of absorption to laser energy that is subsequently used to blow the fuse during programming of memory on the integrated circuit device. In this manner, a minimal level of laser energy is needed to blow the fuse, thereby reducing the risk of dielectric cracking caused by the absorption of excess laser energy, and reducing laser exposure of the first dielectric layer underlying the fuse structure.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1A:
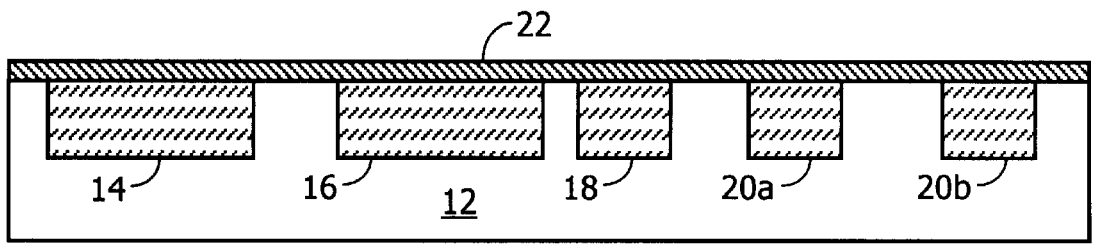
FIGS. 1A–1H depict a metal-insulator-metal capacitor and fuse structure formed according to a preferred embodiment of the invention.

Referring now to FIGS. 1A–1H and FIGS. 2A and 2B, the steps of an integrated circuit fabrication process according to a preferred embodiment of the invention are generally depicted. Described below are the major steps in the process according to the invention. Other steps not described in detail herein may also be required to complete the processing, such as photoresist removal and rinsing steps.

The steps of the process described below are preferably performed on a structure such as depicted FIG. 1A. This starting structure preferably includes a first dielectric layer 12 in which several electrically conductive structures are formed. The first dielectric layer 12 is preferably formed from silicon dioxide or a low dielectric constant (low k) electrically insulating material.

The conductive structures in the layer 12 include a pad electrode 14, a first capacitor plate 16, a capacitor electrode 18, and fuse electrodes 20a and 20b. The conductive structures 14, 16, 18, 20a, and 20b may be formed from various metals, such as copper or aluminum, but are most preferably formed from copper using a damascene fabrication process, as given in step 100 in FIG. 2A. The first capacitor plate 16 serves as a capacitor plate of a metal-insulator-metal capacitor formed according to the invention, and may also be referred to herein as the lower capacitor plate or the capacitor bottom plate.

It is appreciated that the structure shown in FIG. 1A is merely an example of a structure on which the steps according to the invention may be performed. Thus, the scope of the invention is not limited by the structure on which the steps of the process are performed.

As shown in FIG. 1A, a second dielectric layer 22 is formed adjacent the layer 12 and overlying the conductive structures 14, 16, 18, 20a, and 20b, as given in step 102. The layer 22, which is most preferably silicon nitride, may be formed by various processes, such as sputtering or chemical vapor deposition. As discussed in more detail hereinafter, the layer 22 serves as a dielectric separator between two conductive plates in a metal-insulator-metal capacitor formed according to the invention. Thus, the layer 22 preferably has certain dielectric properties, such as breakdown voltage and dielectric constant, that are compatible with the desired characteristics of the capacitor to be formed. Although silicon nitride provides these desired properties, other similar materials having these preferred properties may also be used. Thus, the present invention is not limited to any particular material for the second dielectric layer 22. The layer 22 serves other purposes related to the fuse structure, as described in more detail hereinafter.

Although the invention is not limited to any particular thickness, the preferred thickness of the layer 22 is most preferably about four hundred angstroms. The thickness of the dielectric layer 22, which tends to have an affect on the electrical characteristics of the metal-insulator-metal capacitor, is preferably controlled by the process of depositing the layer 22 and by processes to which the layer 22 is exposed during subsequent processing steps, as discussed hereinafter.

Figure 1B:
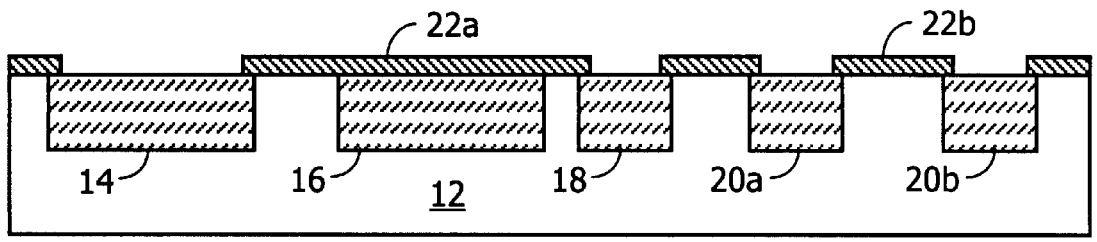

The structure as shown in FIG. 1A is patterned, such as by covering with photoresist, patterning, and etching to remove portions of the layer 22, thereby forming the structure shown in FIG. 1B, as given in step 104. After patterning, the remaining sections of the layer 22 include a capacitor dielectric section 22a and a fuse barrier section 22b. In the preferred embodiment of the invention, the fuse barrier section 22b serves as a passivation layer between the dielectric layer 12 and the bottom of a fuse structure formed in subsequent steps of the process. Portions of the layer 22 also preferably act as a copper diffusion barrier. Preferably, the patterning step 104 exposes the pad electrode 14, the capacitor electrode 18, and the fuse electrodes 20a and 20b.

The simultaneous formation of the capacitor dielectric section 22a and the fuse barrier section 22b in a single patterning and etching step is one of the significant advantages of the invention. In previous fabrication processes, these structures were formed in separate patterning steps, each requiring its own photomask. By combining the patterning and etching of these structures in one step, only one photomask is required, thus reducing the fabrication cost and time.

Figure 1C:
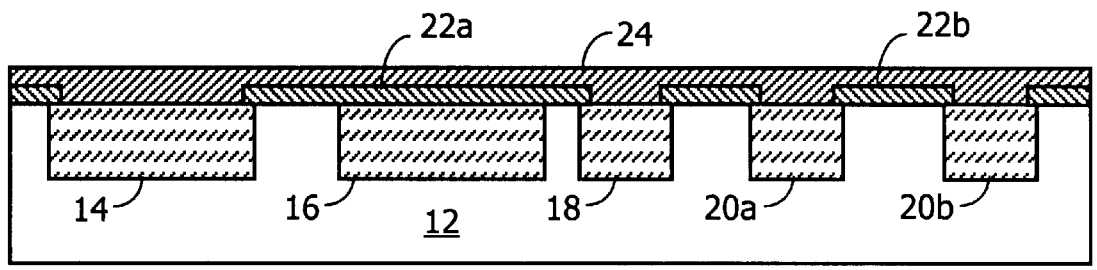

As shown in FIG. 1C, a conductive layer 24 is formed over the pad electrode 14, the capacitor dielectric section 22a, the capacitor electrode 18, the fuse electrodes 20a and 20b, and the fuse barrier section 22b, as given in step 106. The layer 24, which is most preferably titanium nitride, may be formed by various processes, such as sputtering or chemical vapor deposition. The preferred thickness of the layer 24 is about two hundred and fifty angstroms. In alternate embodiments, the layer 24 may be formed from titanium, tantalum, tantalum nitride, or other materials having properties consistent with the functions of the layer 24 as described herein.

Figure 1D:
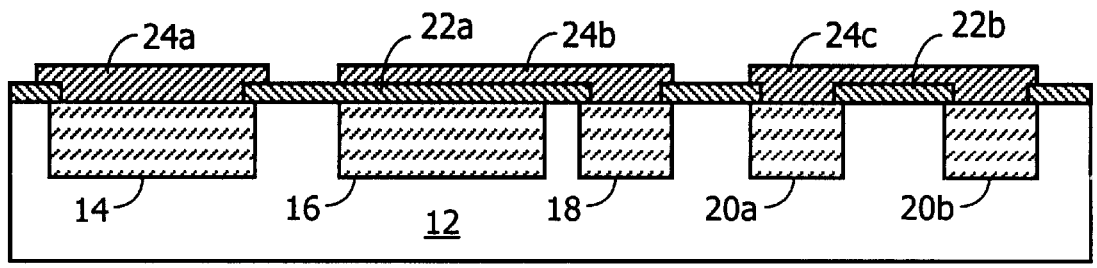

The structure as shown in FIG. 1C is patterned, such as by covering with photoresist, patterning, and etching to remove portions of the layer 24, thereby forming the structure shown in FIG. 1D, as given in step 108. After patterning, the remaining sections of the conductive layer 24 include a pad bond layer 24a, a second capacitor plate 24b, and a fuse 24c. The second capacitor plate 24b may also be referred to herein as the upper capacitor plate or the capacitor top plate. As shown in FIG. 1D, the pad bond layer 24a makes electrical contact with the pad electrode 14, the upper capacitor plate 24b contacts the capacitor electrode 18, and the fuse 24c contacts the fuse electrodes 20a and 20b.

The simultaneous formation of the pad bond layer 24a, the capacitor top plate 24b, and the fuse 24c in a single patterning and etching step is another of the significant advantages of the invention. In previous fabrication processes, these structures were formed in separate patterning steps, each requiring a separate photomask. Combining the patterning and etching of these structures in a single step further reduces fabrication cost and time.

Figure 1E:
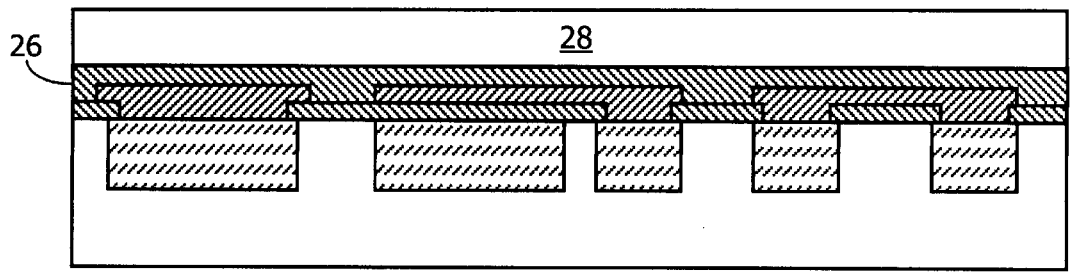

As shown in FIG. 1E, a third dielectric layer 26, also referred to herein as an etch-stop layer, is formed overlying the pad bond layer 24a, the second capacitor plate 24b, and the fuse 24c, as given in step 110. The layer 26, which is most preferably silicon nitride, may be formed by various processes, such as sputtering or chemical vapor deposition.

With continued reference to FIG. 1E, a fourth dielectric layer 28 is preferably formed overlying the third dielectric layer 26, as given in step 112. The layer 28, which is most preferably silicon dioxide or a low k dielectric material, may be formed by various processes, such as spin-on coating or chemical vapor deposition. The structure as shown in FIG. 1E is patterned, such as by covering with photoresist, patterning, and etching to remove portions of the layers 28 and 26, thereby exposing the pad bond layer 24a, as shown in FIG. 1F, and as given in step 114.

Figure 1F:
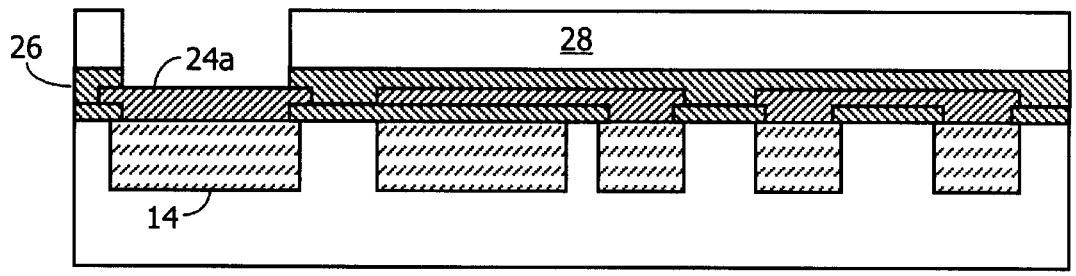
Figure 1G:
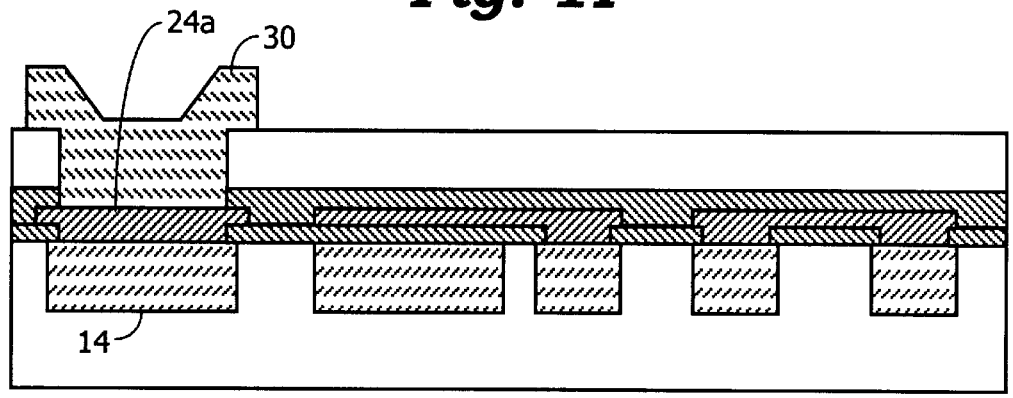

In the preferred embodiment of the invention, an aluminum layer is next deposited on the structure depicted in FIG. 1F, such as by electroplating, chemical vapor deposition, sputtering, or another deposition process consistent with the materials, processes, and structures described herein, as given in step 116. The aluminum layer is patterned and etched to form a pad contact 30, as shown in FIG. 1G and given in step 118.

Figure 1H:
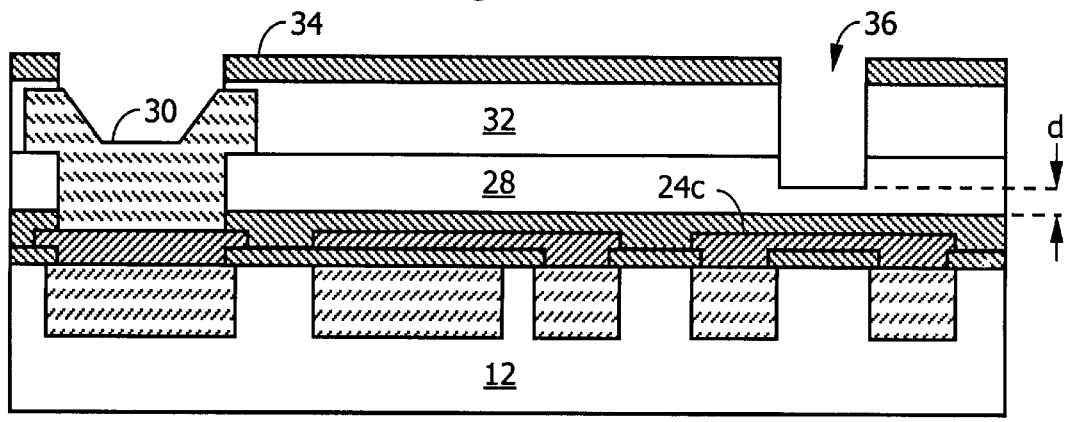
Figure 2A:
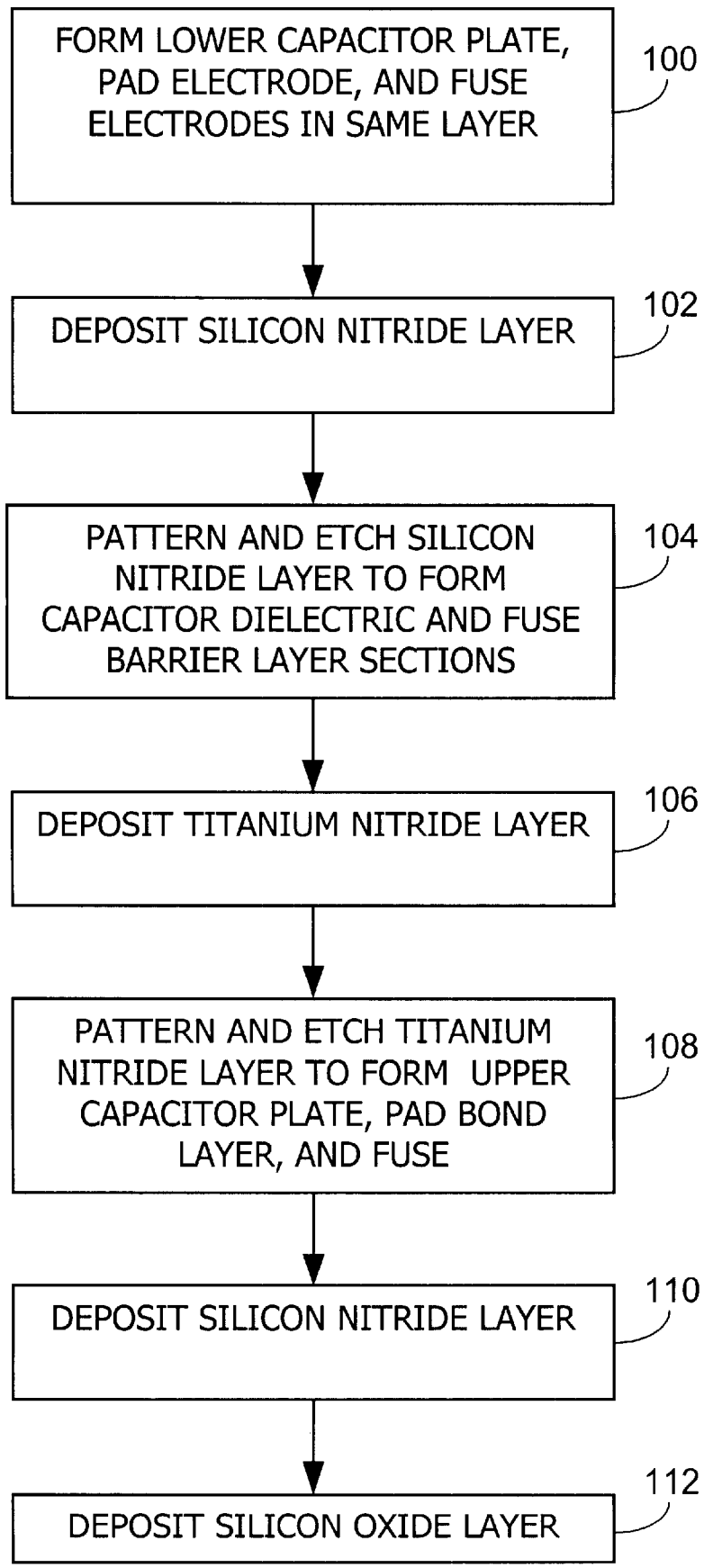
FIGS. 2A–2B depict a process flow for forming a metal-insulator-metal capacitor and fuse structure according to a preferred embodiment of the invention.
Figure 2B:
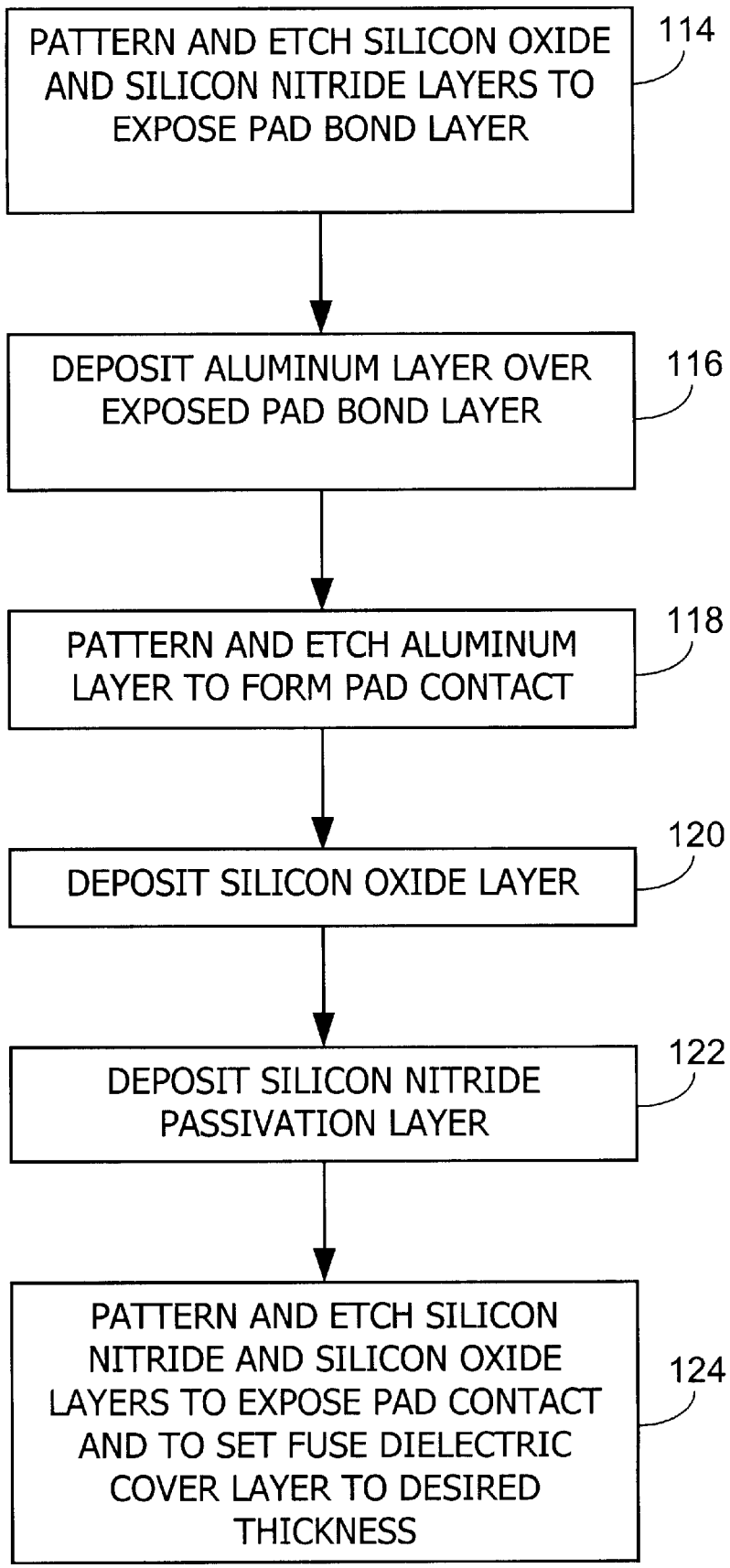

As depicted in FIG. 1H, a dielectric layer 32, such as silicon dioxide, and a passivation layer 34, such as silicon nitride, are deposited, such as by chemical vapor deposition, as given in steps 120 and 122. These layers 32 and 34 are subsequently patterned and etched to expose the pad contact 30, as given in step 124.

In the preferred embodiment, a laser window 36 is also formed during the step 124 by removing the passivation layer 36 and a portion of the silicon oxide layers 32 and 28 overlying the fuse 24c. As shown in FIG. 1H, the remaining silicon dioxide over the fuse 24c in the laser window 36 has a thickness d, which is determined based at least in part upon the duration of the etch step. Preferably, the thickness d is set to minimize the absorption of laser energy in the silicon oxide layer 28, thereby reducing the amount of laser energy needed to blow the fuse 24c during programming of memory on the integrated circuit. Thus, a lower level of laser energy is needed to blow the fuse 24c of the present invention as compared to the level of laser energy which would be needed to penetrate the full stack of dielectric layers 34, 32, and 28. This reduces the risk of dielectric cracking caused by the absorption of excess laser energy. Also, reducing the level of laser energy required to blow the fuse reduces laser damage to the layers underlying the fuse 24c.

Another advantage provided by the process of the invention is that the fuse 24c is completely encapsulated within dielectric material when the fuse 24c is blown by the laser energy. This dielectric encapsulation reduces the occurrence of residual metal particles formed during the fuse blowing process from shorting to adjacent fuse or other conductive structures in the integrated circuit. This tends to increase fabrication yield and circuit reliability.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A process for simultaneously forming a capacitive structure and a fuse structure in an integrated circuit device, the process comprising:

(a) forming a first capacitor plate and first and second fuse electrodes in a first dielectric layer of the device, (b) in a second dielectric layer of the device overlying the first dielectric layer, simultaneously forming a capacitor dielectric section overlying the first capacitor plate, and a fuse barrier section overlying and between the first and second fuse electrodes, and (c) in a conductive layer of the device overlying the second dielectric layer, simultaneously forming a second capacitor plate overlying the capacitor dielectric section, and a fuse overlying the fuse barrier section and contacting the first and second fuse electrodes.

2. The process of claim 1 wherein step (b) further comprises selectively removing portions of the first dielectric layer to simultaneously define the capacitor dielectric section and the fuse barrier section.

3. The process of claim 1 wherein step (b) further comprises forming the second dielectric layer of silicon nitride.

4. The process of claim 1 wherein step (c) further comprises selectively removing portions of the conductive layer to simultaneously define the second capacitor plate and the fuse.

5. The process of claim 1 wherein step (c) further comprises forming the conductive layer of titanium nitride.

6. The process of claim 1 wherein step (c) further comprises forming the conductive layer of tantalum nitride.

7. The process of claim 1 further comprising:

(d) forming an etch stop layer overlying the second capacitor plate and the fuse, and (e) forming a fourth dielectric layer overlying the etch stop layer.

8. The process of claim 7 wherein:

step (d) further comprises forming the etch stop layer from silicon nitride, and step (e) further comprises forming the fourth dielectric layer from silicon oxide.

9. The process of claim 7 further comprising:

(f) selectively removing a portion of the fourth dielectric layer such that a desired thickness of the fourth dielectric layer remains over the fuse, the desired thickness of the fourth dielectric layer introducing a minimal amount of absorption to laser energy used to blow the fuse.

10. The process of claim 1 wherein step (a) further comprises forming the first capacitor plate and the first and second fuse electrodes from copper using damascene processing.

11. The process of claim 1 further comprising:

step (a) including forming a pad electrode in the first dielectric layer of the device, and step (c) including forming a pad bond layer in the conductive layer of the device overlying the pad diffusion barrier.

12. The process of claim 11 further comprising:

(d) forming an etch stop layer overlying the second capacitor plate, the pad electrode, and the fuse, (e) forming a dielectric layer overlying the etch stop layer, (f) selectively removing a portion of the etch stop layer and the dielectric layer to expose the pad bond layer, and (g) forming a pad contact overlying and contacting the pad bond layer.

13. The process of claim 12 wherein step (g) further comprises forming the pad contact from aluminum.

14. A process for simultaneously forming a capacitive structure and a fuse structure in an integrated circuit device, the process comprising:

(a) forming a first capacitor plate and first and second fuse electrodes in a first dielectric layer of the device, (b) in a second dielectric layer of the device overlying the first dielectric layer, simultaneously forming a capacitor dielectric section overlying the first capacitor plate, and a fuse barrier section overlying and between the first and second fuse electrodes, (c) in a conductive layer of the device overlying the second dielectric layer, simultaneously forming a second capacitor plate overlying the capacitor dielectric section, and a fuse overlying the fuse barrier section and contacting the first and second fuse electrodes, (d) forming a third dielectric layer overlying the conductive layer, and (f) selectively removing a portion of the third dielectric layer over the fuse such that a desired thickness of the third dielectric layer remains over the fuse, the desired thickness of the third dielectric layer introducing a minimal amount of absorption to laser energy used to blow the fuse.

15. A process for simultaneously forming a capacitive structure and a fuse structure in an integrated circuit device, the process comprising:

(a) forming a first capacitor plate, a pad electrode, and first and second fuse electrodes in a first dielectric layer of the device, (b) forming a second dielectric layer overlying the first dielectric layer, (c) selectively removing portions of the second dielectric layer to simultaneously define a capacitor dielectric section overlying the first capacitor plate, and a fuse barrier section overlying and between the first and second fuse electrodes, (d) forming a conductive layer overlying the capacitor dielectric section, the fuse barrier section, and the pad diffusion barrier, (e) selectively removing portions of the conductive layer to simultaneously define a second capacitor plate overlying the capacitor dielectric section, a pad bond layer overlying the pad electrode, and a fuse overlying the fuse barrier section, the fuse contacting the first and second fuse electrodes.

16. The process of claim 15 further comprising:

(f) forming an etch stop layer overlying the second capacitor plate, the pad electrode, and the fuse, (g) forming a third dielectric layer overlying the etch stop layer, (h) selectively removing a portion of the etch stop layer and the third dielectric layer to expose the pad bond layer, and (i) forming a pad contact overlying and contacting the pad bond layer.

* * * * *